April 27, 1965 F. G. MASON 3,181,093

CAVITY RESONATOR WITH VARIABLE TUNING

Filed Oct. 6, 1961

INVENTOR.
Francis G. Mason
BY Dons McDougall and Hersh
Att'ys 3,181,093

CAVITY RESONATOR WITH VARIABLE TUNING

Francis G. Mason, Weston, Conn., assignor to Aladdin Industries, Incorporated, Chicago, Ill., a corporation of Illinois Filed Oct. 6, 1961, Ser. No. 143,343
3 Claims. (Cl. 333—83)

This invention relates to a variable tuner which is especially applicable to equipment for receiving, transmitting, or otherwise handling ultra high-frequency signals.

One object of the present invention is to provide a new and improved tuner of the type utilizing a resonant cavity for the variable tuning element.

A further object is to provide a new and improved variable cavity-type tuner which is capable of covering an extremely wide range of frequencies.

Another object is to provide a new and improved tuner of the foregoing character in which the cavity is provided with a center post, and in which the tuning variation is accomplished by moving a sleeve or other electrode along the center post.

A further object is to provide a new and improved tuner of the foregoing character, in which the center post is formed with two overlapping portions, adapted to be spanned in a variable manner by the tuning electrode.

Another object is to provide a new and improved tuner construction which is especially applicable to a tuner adapted to operate with a high degree of precision over a wide frequency range.

Further objects and advantages of the present invention will appear from the following description, taken in connection with accompanying drawings, in which.

Figure 1:
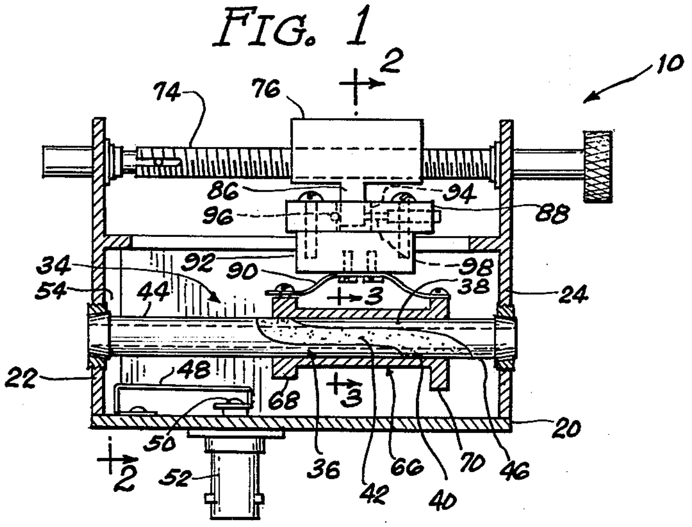
FIG. 1 is an elevational sectional view showing a tuner to be described as in illustrative embodiment of the present invention, the view being taken generally along the broken line 1—1 in FIG. 2.
Figure 2:
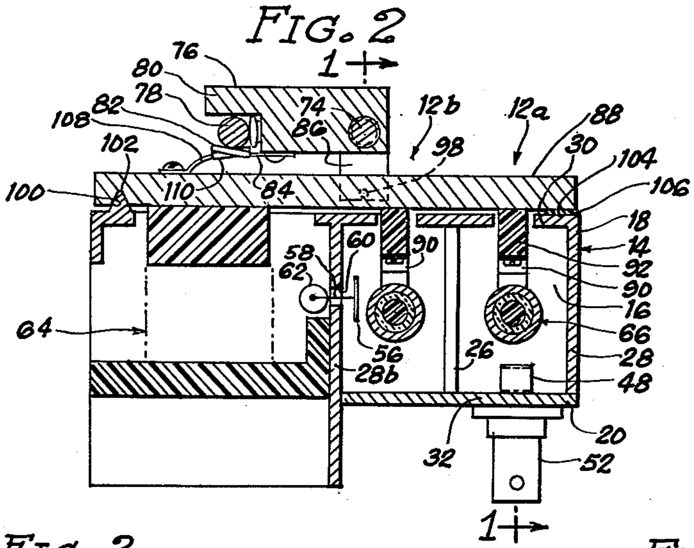
FIG. 2 is a cross-sectional view, taken generally along the broken line 2—2 in FIG. 1.

As already indicated, FIGS. 1 and 2 illustrate a tuner 10 which will find many applications in equipment for receiving, transmitting, or otherwise handling ultra high-frequency signals. Thus, the illustrated tuner may be arranged to cover the frequency range from 315–1000 megacycles, or any other suitable frequency range.

The illustrated tuner 10 actually comprises two similar tuner stages or sections 12*a* and 12*b* which may be employed as the preselector stages of a superheterodyne radio receiver. For the most part, the following description will be directed to the first tuner stage 12*a*. The second tuner stage 12*b* may be considered to be the same, except as otherwise specifically indicated.

The illustrated tuner section 12*a* is of the cavity type and thus comprises a conductive metal body 14 which is formed with an internal cavity or chamber 16. The body 14 may be in the form of a metal casting 18, having a cover plate 20 secured to one side thereof. In this case, the cavity 16 is rectangular in shape, but any other suitable shape may be utilized. Thus, the cavity 16 is bounded by end walls 22 and 24, side walls 26 and 28, a top wall 30, and a bottom wall 32. In this case, the bottom wall 32 is formed by the cover plate 20. The side wall 26 is in the form of a partition between the cavities of the first and second tuner sections 12*a* and 12*b*.

The illustrated cavity tuner section 12*a* is of the reentrant type and thus is provided with a center post 34 which extends longitudinally in the cavity 16. In accordance with the present invention, the center post 34 takes the form of two overlapping sections or members 36 and 38 which are connected to opposite end walls of the body 14. In this case, the overlapping portions 36 and 38 are connected to the end walls 22 and 24, respectively.

In order that the tuner may be made with a high degree of precision, yet at moderate cost, the two portions 36 and 38 of the center post 34 are preferably formed as thin patterned metal coatings or members on a cylinder or rod 40, which may be made of a suitable insulating material, such as steatite, glass, or various other ceramic or plastic materials. The metal coatings or members which make up the center post sections 36 and 38 may be applied to or formed on the insulating member 40 in the desired patterns by the utilization of well known printed circuit techniques.

A gap or band 42 of the insulating material is provided between the overlapping sections 36 and 38. It will be seen that the center post section 36 extends from a conductive cylindrical member 44 which is connected to the end wall 22. Similarly, the section 38 extends from a conductive cylindrical member 46 which is connected to the end wall 24. The section 36 is disposed on one side portion of the cylindrical insulating member 40, while the section 38 is disposed on the opposite side portion thereof. The section 36 projects toward the end wall 24 but is insulated therefrom. Similarly, the section 38 projects toward the end wall 22 but is insulated therefrom.

Input and output connections may be made to the cavity sections 12*a* and 12*b* in any known or suitable manner. Various input and output elements are well known to those skilled in the art. In the illustrated tuner 10, an input connection is made to the initial tuner section 12*a* by means of a coupling loop 48 which is connected between an input terminal 50 and the cover plate 20 of the body 14. A connector 52 may be mounted on the plate 20 for the purpose of connecting the input terminal 50 to a coaxial input cable. It will be seen that the loop 48 is disposed longitudinally in the cavity 16, at one end thereof, adjacent the end wall 22 and the center post section 36. With this arrangement, the magnetic field in the cavity is strongest in the end portion of the cavity adjacent the loop 48.

In the illustrated arrangement, energy is coupled between the cavity sections 12*a* and 12*b* by means of a slot 54 which is formed in the partition 26, at the end of the cavity adjacent the end wall 22 and the loop 48. The slot 54 permits magnetic interlinkage between the tuner sections 12*a* and 12*b* so that signals will be magnetically coupled therebetween.

The output from the second cavity section 12*b* may be taken by means of a second coupling loop 56 which is similar to the loop 48 but is connected between one side 28*b* of the cavity section 12*b* and an output lead 58. As shown, the output lead 58 extends through a small opening 60 in the side wall 28*b* and is connected to a diode rectifier 62 which serves as the mixer of the superheterodyne radio receiver. The tuner 10 also has an oscillator section 64 which, however, forms no part of the present invention and will not be described in detail.

The resonant frequency of the illustrated tuner section 12*a* is varied by moving an electrode 66 along the center post 34. As shown, the electrode 66 takes the form of a conductive metal sleeve or cylinder which is slidably received around the center post 34. Outwardly projecting flanges 68 and 70 are formed on the opposite ends of sleeve 66.

Figure 3:
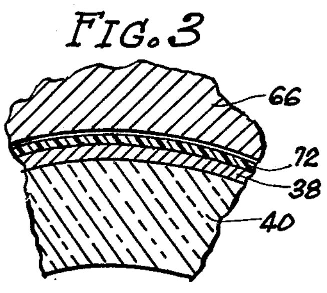
FIG. 3 is a fragmentary, greatly enlarged cross-sectional view, taken generally along the line 3—3 in FIG. 1.
Figure 4:
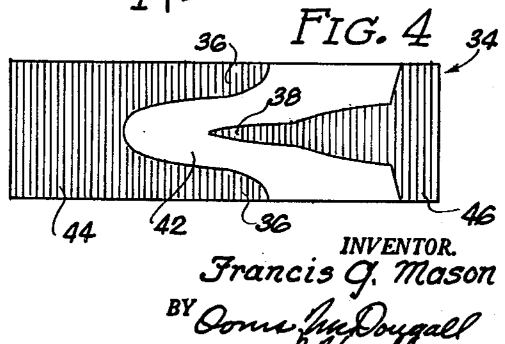
FIG. 4 is a developed view of the center post employed in the tuner.

An insulating layer or space is provided between the sleeve 66 and the center post 34 so that the sleeve will be capacitively coupled to the center post sections 36 and 38. In the illustrated construction, the insulating layer takes the form of a thin coating 72 (FIG. 3) of insulating material on the outside of the center post 34. The coating conveniently may be applied to all of the exposed outer surfaces of the portions 36, 38, 40, 44 and 46. It will be realized that an insulating film might alternatively be applied to the inside of the sleeve 66. The insulating layer may be made of any suitable low-loss plastic material, such as Teflon, which has the particular advantage of reducing the friction between the sleeve 66 and the center post.

The movement of the sleeve 66 has the effect of varying the capacitance between center post sections 36 and 38. This in turn has the effect of varying the resonant frequency of the cavity tuner section. As shown in FIG. 1, the sleeve 66 almost completely surrounds both center post sections 36 and 38. This represents approximately the position of maximum capacitive coupling between the sections 36 and 38. Thus, the position of the sleeve 66, as shown in FIG. 1, represents approximately the low frequency end of the tuning range. It will be understood that the sleeve 66 is capacitively coupled to both center post sections 36 and 38 and thus is the means of establishing increased capacitive coupling between the center post sections.

The sleeve 66 may be moved to the left, as shown in FIG. 1, so as to disengage the sleeve in a progressive manner from the center post section 38. Such movement of the sleeve reduces the capacitance between the center post sections 36 and 38. In its position of extreme movement to the left, the sleeve 66 is received around the cylindrical conductor 44 so that the capacitive coupling between the center post sections 36 and 38 is at a minimum. This position represents the extreme high frequency end of the tuning range.

To provide for the desired movement of the sleeve 66, the tuner 10 is provided with a precision lead screw 74 which may be rotated by any suitable drive. A traveling nut 76 is threaded onto the lead screw 74 and is prevented from rotating by means of a guide rod 78. It will be seen that the nut 76 is formed with an arm 80 which engages the upper side portion of the guide rod 78. The lower side portion of the rod 78 may be engaged by an anti-friction pad 82 on the outer end of a leaf spring 84 which is mounted on the underside of the nut 76.

The illustrated nut 76 has a downwardly projecting tongue 86 adapted to operate a movable carriage 88 on which the sleeve 66 is mounted. In this case, a bow-shaped leaf spring 90 is employed to connect the sleeve 66 to the carriage 88. The ends of spring 90 are connected to the flanges 68 and 70 on the sleeve 66. The center portion of the spring 90 is connected to an insulating block 92 which is secured to the underside of the carriage 88. Thus, the sleeve 66 is insulated from the carriage 88. No external electrical connection is made to the sleeve 66.

In the illustrated construction, the tongue 86 extends into a slot 90 formed in the carriage 88. A ball 96 may be interposed between one side of the slot 94 and the tongue 86. The other side of the tongue may be engaged by a spring-pressed pin 98 mounted in the carriage 88.

As shown to advantage in FIG. 2, one end portion of the illustrated carriage 88 is formed on its underside with a V-shaped groove 100 which is slidable along a stationary V-shaped way or slide 102. In this way, the carriage is constrained to slide along a straight line path. The other end of the sleeve 88 is guided by an upwardly facing flat surface or way 104 which may be formed on the upper side of the casting 18. The carriage 88 may be fitted with an anti-friction pad 106, adapted to slide along the flat surface 104.

The springs 90 of the cavity sections 12*a* and 12*b* have the effect of pulling the carriage 88 downwardly against the flat guiding surface 104. At the same time the springs 90 provide uniform upward pressure on the sleeves 66 so that the sleeves will slide easily along the center post 34. To provide additional spring pressure between the carriage 88 and the V-shaped way 102, a leaf spring 108 is mounted on the carriage. The outer end of the leaf spring 108 is provided with an anti-friction pad 110 which engages the underside portion of the guide rod 78.

The illustrated drive arrangements eliminates any play or binding effect between the various movable elements of the drive, so that the sleeve 66 may be translated easily and with a high degree of precision. The illustrated drive reduces backlash to such an extent that it is virtually negligible. Thus, the tuner may be reset to a desired position with an extremely high degree of precision.

As previously indicated, the movement of the sleeve 66 along the center post 34 changes the amount of capacitance between the center post sections 36 and 38. In this way, the resonant frequency of the tuner cavity section is varied. An extremely wide range of frequencies may be covered. Thus, the range from 315 to 1000 megacycles may be covered with only about 1½ inches of sleeve travel.

The illustrated cavity tuner construction is highly efficient electrically. It has been found that unloaded Q values in the range from 700 to 1100 can readily be obtained.

Various modifications, alternative constructions and equivalents may be employed without departing from the true spirit and scope of the invention as exemplified in the foregoing description and defined in the following claims.

I claim:

1. In a tuner for ultra high-frequencies, the combination comprising a conductive body having a cavity therein, input and output means for coupling signals to and from said cavity, said cavity having first and second opposite end walls, a cylindrical center post in said cavity and having first and second longitudinal generally parallel diametrically opposite overlapping conductive portions connected to said first and second end walls, said first and second portions being insulated from each other and having a longitudinal gap therebetween, said center post including a cylindrical insulating member for supporting said first and second portions, said first and second portions being formed as conductive cylindrically curved coatings on diametrically opposite portions of said insulating member, said center post having an insulating coating thereon, a conductive sleeve received around said center post and slidable therealong, said insulating coating being disposed between said sleeve and said first and second portions and being effective to afford capacitive coupling therebetween, and means for moving said sleeve along said center post for varying the capacitance between said first and second portions, and thereby varying the resonant frequency of said cavity.

2. In a tuner, the combination comprising a conductive body having a cavity therein, said cavity having first and second opposite end walls, a cylindrical center post in said cavity and having a first and second longitudinal generally parallel diametrically opposite overlapping conductive portions connected to said first and second end walls, said first and second portions being insulated from each other and having a longitudinal gap therebetween, said center post including a cylindrical insulating member for supporting said first and second portions, said first and second portions being formed as conductive cylindrically curved coatings on diametrically opposite portions of said insulating member, said center post having an insulating coating thereon, a conductive sleeve received around said center post and slidable therealong, said insulating coating being disposed between said sleeve and said first and second portions and being effective to afford capacitive coupling therebetween, and means for moving said sleeve along said center post for varying the capacitance between said first and second portions, and thereby varying the resonant frequency of said cavity.

3. In a tuner for ultra high-frequencies, the combination comprising a conductive body having a cavity therein, input and output means for coupling signals to and from said cavity, said cavity having first and second opposite end walls, a cylindrical center post in said cavity and including a cylindrical insulating member extending between said first and second end walls, said center post including first and second parallel longitudinally extending diametrically opposite overlapping conductive members connected to said first and second end walls and mounted on the outside of said cylindrical insulating member, said first and second conductive members being cylindrically curved and being insulated from each other with a longitudinal gap therebetween, a conductive sleeve received around said center post and slidable therealong, means affording insulating material between said sleeve and said first and second conductive members of said center post to provide capacitive coupling therebetween, and means for moving said sleeve along said center post for varying the capacitance between said first and second conductive members so as to vary the resonant frequency of said cavity.

References Cited by the Examiner

UNITED STATES PATENTS

| | | | |
|---|---|---|---|
| 2,092,708 | 9/39 | Wheeler | 334—41 |
| 2,744,220 | 5/56 | Matteson | 317—249 |
| 2,758,268 | 8/56 | Peyssou | 317—249 |
| 2,797,583 | 7/57 | Leschenski | 74—10.85 |
| 2,826,698 | 3/58 | Mason | 334—41 |
| 2,834,216 | 5/58 | Thompson | 74—10.85 |
| 2,871,345 | 1/59 | Napolin | 333—83 X |
| 2,890,425 | 6/59 | Regnier | 333—83 X |
| 2,906,329 | 9/59 | Frerer et al. | 200—334 |
| 2,994,009 | 7/61 | Schmidt et al. | 333—83 X |
| 3,090,920 | 5/63 | Levine | 333—83 X |

HERMAN KARL SAALBACH, *Primary Examiner.*